(12) United States Patent
Lai et al.

(10) Patent No.: US 7,602,255 B1
(45) Date of Patent: Oct. 13, 2009

(54) LOOP CIRCUITS THAT REDUCE BANDWIDTH VARIATIONS

(75) Inventors: Kang-Wei Lai, Milpitas, CA (US); Ninh D. Ngo, Palo Alto, CA (US); Kazi Asaduzzaman, Fremont, CA (US); Mian Z. Smith, Los Altos, CA (US); Wanli Chang, Saratoga, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 100 days.

(21) Appl. No.: 11/861,144

(22) Filed: Sep. 25, 2007

(51) Int. Cl.
*H03L 7/00* (2006.01)
(52) U.S. Cl. .................. 331/16; 331/34; 331/177 R; 331/176; 331/175; 331/185
(58) Field of Classification Search ............... 331/176, 331/16, 34, 175, 185, 177 R
See application file for complete search history.

(56) References Cited

U.S. PATENT DOCUMENTS

| | | | |
|---|---|---|---|
| 6,411,142 | B1 | 6/2002 | Abbasi et al. |
| 6,687,881 | B2 | 2/2004 | Gauthier et al. |
| 7,151,418 | B1 | 12/2006 | Chew et al. |
| 7,365,581 | B2 * | 4/2008 | Shi et al. .................. 327/156 |
| 2005/0156673 | A1 | 7/2005 | Pretl et al. |

OTHER PUBLICATIONS

U.S. Appl. No. 11/558,800, filed Nov. 10, 2006, Lai et al.
Gabriel A. Rincon-Mora, "Voltage References: From Diode to Precision High-Order Bandgap Circuits," IEEE Press, 2002, pp. 23-29.
Philip E. Allen, et al., "CMOS Analog Circuit Design," Second Edition, Oxford University Press, 2002, pp. 142-153.
Kyoohyun Lim et al., "A Low-Noise Phase-Locked Loop Design by Loop Bandwidth Optimization," IEEE Journal of Solid State Circuits, vol. 35, No. 6, Jun. 2000, pp. 807-815.
John G. Maneatis, "Low-Jitter Process-Independent DLL and PLL Based on Self-Biased Techniques," IEEE Journal of Solid-State Circuits, vol. 31, No. 11, Nov. 1996, pp. 1723-1732.

* cited by examiner

*Primary Examiner*—Arnold Kinkead
(74) *Attorney, Agent, or Firm*—Steven J. Cahill

(57) ABSTRACT

A feedback loop, such as a phase-locked loop, on an integrated circuit has a detector, a charge pump, and a loop filter. The charge pump adjusts its output current in response to variations in a process of the integrated circuit to reduce variations in the loop bandwidth. The charge pump also adjusts its output current in response to variations in a resistance of a resistor in the loop filter to reduce variations in the loop bandwidth. The charge pump can also adjust its output current in response to variations in a temperature of the integrated circuit to reduce variations in the loop bandwidth. A delay-locked loop on an integrated circuit has a phase detector and a charge pump. The charge pump adjusts its output current in response to variations in the temperature and the process of the integrated circuit to reduce changes in the loop bandwidth.

20 Claims, 9 Drawing Sheets

US 7,602,255 B1

LOOP CIRCUITS THAT REDUCE BANDWIDTH VARIATIONS

BACKGROUND OF THE INVENTION

The present invention relates to electronic circuits, and more particularly, to loop circuits that reduce bandwidth variations.

A phase-locked loop (PLL) is an electronic circuit that generates one or more periodic (clock) output signals. A PLL adjusts the frequency of a feedback signal from the output of an oscillator to match in phase the frequency of an input reference clock signal. Phase-locked loops (PLLs) are an essential building block of many integrated circuits, providing periodic signals for data recovery, data transfer, and other clocking functions. PLLs often supply a clock signal to one or more counters or dividers that divide a signal from the oscillator to a lower frequency clock signal for distribution around an integrated circuit or system.

The noise performance of a PLL depends in part on the design of the individual components in the PLL. The noise performance of a PLL also depends heavily on the loop bandwidth. The loop bandwidth of a typical PLL is sensitive to variations in temperature, process, and the power supply voltage. For example, variations in temperature can cause the noise performance of a PLL to degrade dramatically.

Many modern PLLs are required to operate within an industrial temperature range. An industrial temperature range is typically a wide temperature range, e.g., −40° C. to 125° C. Wide temperature variations can cause an even larger degradation in the noise performance of a PLL.

BRIEF SUMMARY OF THE INVENTION

Some embodiments of the present invention relate to feedback loops, such as phase-locked loops, on integrated circuits. The feedback loop has a detector, a charge pump, and a loop filter. The charge pump generates an output current in response to at least one output signal of the detector. The charge pump adjusts the output current in response to variations in a process of the integrated circuit to reduce variations in the loop bandwidth. The charge pump also adjusts the output current in response to variations in a resistance of a resistor in the loop filter to reduce variations in the loop bandwidth.

In some embodiments, the charge pump also adjusts the output current in response to variations in a temperature of the integrated circuit to reduce variations in the loop bandwidth. In some embodiments, a voltage regulator provides a constant, regulated voltage to the charge pump and a voltage-controlled oscillator to reduce the impact of variations in an external supply voltage on the loop bandwidth.

According to other embodiments of the present invention, a delay-locked loop on an integrated circuit has a phase detector and a charge pump. The charge pump generates an output current in response to at least one output signal of the phase detector. The charge pump adjusts the output current in response to variations in the temperature and the process of the integrated circuit to reduce variations in the loop bandwidth.

Various objects, features, and advantages of the present invention will become apparent upon consideration of the following detailed description and the accompanying drawings.

DETAILED DESCRIPTION OF THE INVENTION

Figure 1:
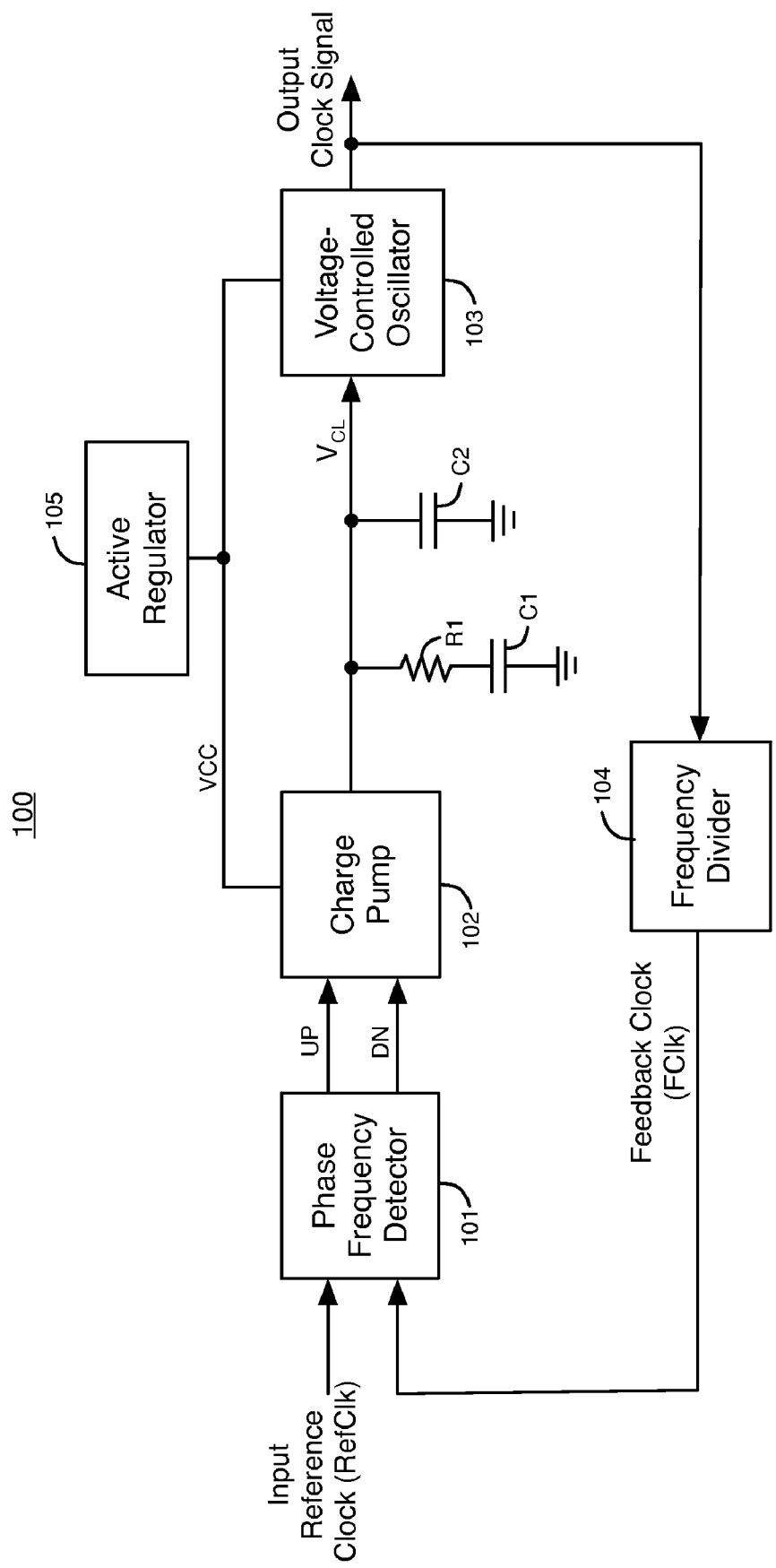
FIG. 1 illustrates a phase-locked loop that can contain embodiments of the present invention.

FIG. 1 illustrates a phase-locked loop (PLL) 100 that can contain embodiments of the present invention. PLL 100 is merely one example of a phase-locked loop that can include embodiments of the present invention. It should be understood that embodiments of the present invention can be used in PLLs having numerous other configurations.

PLL 100 is a feedback loop circuit that includes a phase-frequency detector circuit 101, a charge pump circuit 102, a voltage-controlled oscillator circuit 103, a frequency divider circuit 104, an active regulator circuit 105, resistor R1, and capacitors C1-C2. Phase-frequency detector (PFD) 101 compares the phase and the frequency of an input reference clock signal (RefClk) to the phase and the frequency of a feedback clock signal (FClk) generated by frequency divider 104.

Phase-frequency detector 101 generates UP and DN (down) error signals that are indicative of the difference between the phases and frequencies of RefClk and the feedback clock signal FClk. The UP and DN error signals are transmitted to charge pump 102. Charge pump 102 converts the UP and DN error signals into a control voltage $V_{CL}$ that is transmitted to voltage-controlled oscillator (VCO) 103. Resistor R1 and capacitors C1 and C2 form a low pass filter that attenuates high frequency components of control voltage $V_{CL}$. Resistor R1 and capacitors C1 and C2 function as a loop filter in PLL 100.

Voltage-controlled oscillator (VCO) 103 generates an output clock signal. VCO 103 varies the frequency of its output clock signal in response to changes in the control voltage $V_{CL}$. According to alternative embodiments, PLL 100 can have a current-controlled oscillator or another type of oscillator, instead of VCO 103.

Frequency divider 104 divides the frequency of the output clock signal to generate feedback clock signal FClk. Frequency divider 104 can, for example, be a divide-by-N counter circuit. The counter circuit allows VCO 103 to run at a frequency greater than the frequency of the input reference clock signal RefClk. PLL 100 adjusts the control voltage $V_{CL}$ until both the phase and the frequency of feedback clock signal FClk match the phase and the frequency of reference clock signal RefClk.

Active regulator 105 receives an external power supply voltage and provides a regulated supply voltage VCC to charge pump 102 and to VCO 103. Charge pump 102 and VCO 103 always receive a constant supply voltage VCC, even when the external power supply voltage is unregulated. Voltage regulator 105 provides a clean, constant voltage to VCO 103 and charge pump 102 to reduce or eliminate the impact of variations in the external power supply voltage on the loop bandwidth. As a result, the loop bandwidth $B_{LP}$ of PLL 100 is independent of the external power supply voltage.

The loop bandwidth $B_{LP}$ of PLL 100 is proportional to the charge pump 102 output current $I_{CP}$ times the gain $K_{VCO}$ of VCO 103 times the resistance $R_1$ of resistor R1 as shown in equation (1).

$$B_{LP} \propto I_{CP} \times K_{VCO} \times R_1 \tag{1}$$

Figure 2A:
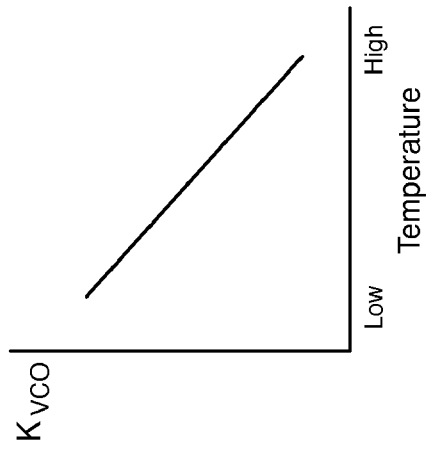
FIG. 2A illustrates the relationship between the gain $K_{VCO}$ of a voltage-controlled oscillator on an integrated circuit and the process of the integrated circuit.

FIG. 2A illustrates the relationship between the gain $K_{VCO}$ of voltage-controlled oscillator (VCO) 103 on an integrated circuit and the process of the integrated circuit (IC). The gain $K_{VCO}$ of VCO 103 increases as variations in the semiconductor fabrication process of the IC cause transistors on the IC to operate faster. The gain $K_{VCO}$ of VCO 103 decreases as variations in the semiconductor fabrication process of the IC cause transistors on the IC to operate slower.

Figure 2B:
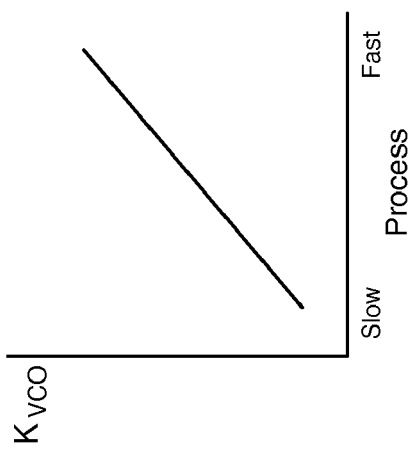
FIG. 2B illustrates the relationship between the gain $K_{VCO}$ of a voltage-controlled oscillator on an integrated circuit and the temperature of the integrated circuit.

FIG. 2B illustrates the relationship between the gain $K_{VCO}$ of voltage-controlled oscillator (VCO) 103 on an integrated circuit (IC) and the temperature of the IC. The gain $K_{VCO}$ of VCO 103 increases as the temperature of the IC decreases, and the gain $K_{VCO}$ of VCO 103 decreases as the temperature of the IC increases.

As mentioned above, the loop bandwidth of a PLL is sensitive to environmental conditions that can cause its noise performance to degrade. Environmental conditions that can affect the noise performance of a PLL include variations in the temperature, variations in the semiconductor fabrication process, and variations in the supply voltage. The noise performance of a PLL can be improved significantly by maintaining the loop bandwidth at a more constant value.

In order to maintain the loop bandwidth $B_{LP}$ of PLL 100 at a more constant value, the output current $I_{CP}$ of charge pump 102 varies to compensate for changes in the gain $K_{VCO}$ of VCO 103 that are caused by fabrication process and temperature variations on the IC, based on the relationship shown in equation (1). For example, the output current $I_{CP}$ of charge pump 102 decreases to compensate for the increase in the gain $K_{VCO}$ of VCO 103 in faster semiconductor processes. Also, the output current $I_{CP}$ of charge pump 102 decreases to compensate for the increase in the gain $K_{VCO}$ of VCO 103 at lower temperatures. In addition, the output current $I_{CP}$ of charge pump 102 varies inversely with the resistance of R1 to compensate for variations in the resistance of resistor R1 with temperature and fabrication process to maintain the loop bandwidth $B_{LP}$ of PLL 100 at a more constant value. Further details of how the charge pump current varies with environmental conditions are described below with respect to FIGS. 3-5.

Figure 3:
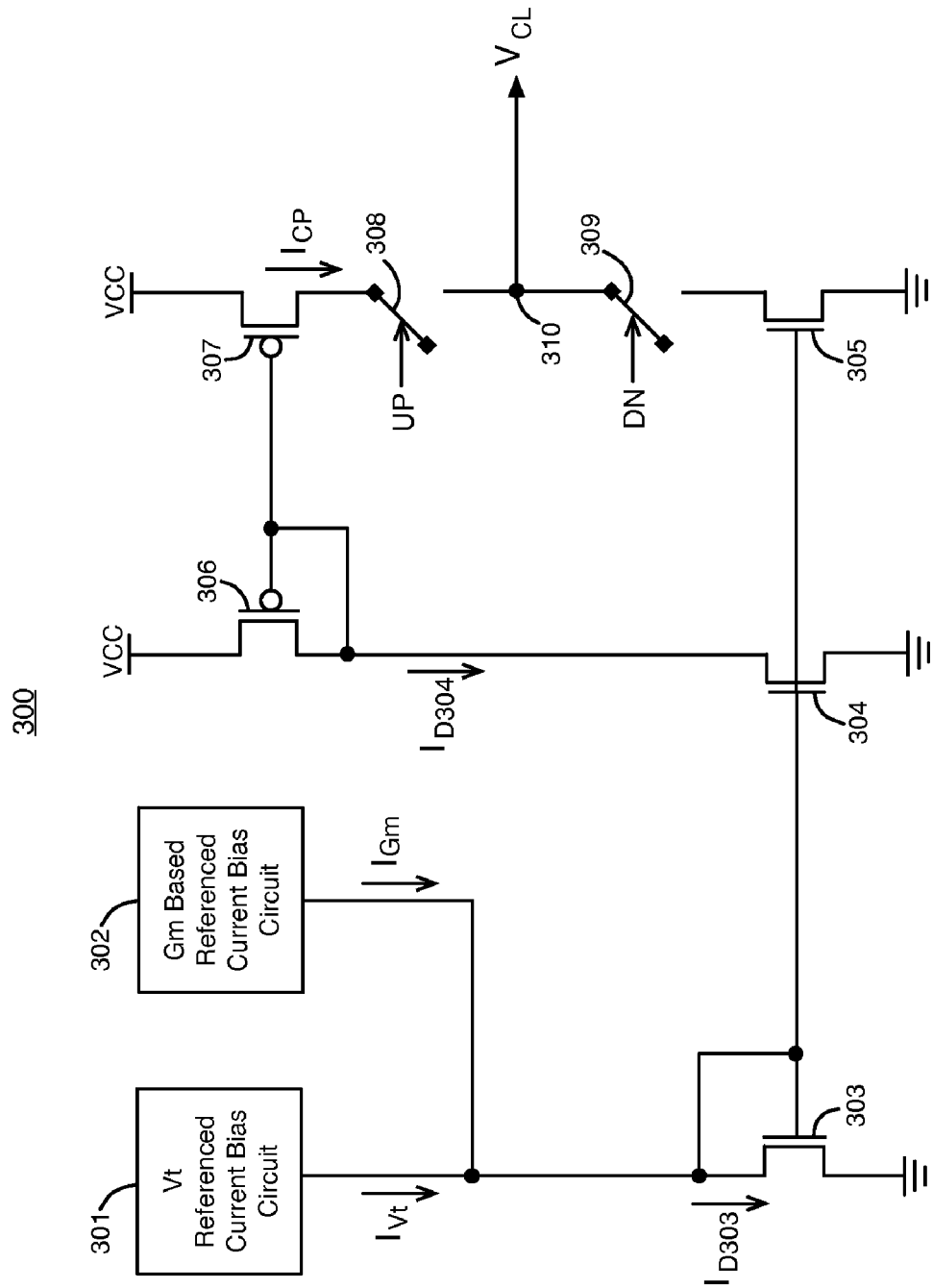
FIG. 3 illustrates an example of a charge pump circuit that compensates for temperature and fabrication process variations on an integrated circuit, according to an embodiment of the present invention.

FIG. 3 illustrates an example of a charge pump circuit that compensates for temperature and fabrication process variations on an integrated circuit, according to an embodiment of the present invention. Charge pump circuit 300 shown in FIG. 3 is an example of charge pump circuit 102 shown in FIG. 1. Charge pump 300 includes Vt referenced current bias circuit 301, Gm based referenced current bias circuit 302, n-channel metal oxide semiconductor field-effect transistors (MOSFETs) 303-305, p-channel MOSFETs 306-307, and switches 308-309. Switches 308-309 can, for example, be implemented by MOSFETs.

In charge pump circuit 300, Vt referenced current bias circuit 301 generates a first current $I_{Vt}$ and Gm based referenced current bias circuit 302 generates a second current $I_{Gm}$. Circuits 301 and 302 generate currents $I_{Vt}$ and $I_{Gm}$ independently of each other. Currents $I_{Vt}$ and $I_{Gm}$ are summed together at the drain of n-channel MOSFET 303. Thus, the drain current $I_{D303}$ of transistor 303 equals $I_{Vt}+I_{Gm}$.

N-channel MOSFETs 303, 304, and 305 form a current mirror circuit. In the example of FIG. 3, transistors 303-305 have the same width-to-length (W/L) channel ratios, although other W/L channel ratios can be used. $I_{D303}$ is the reference bias current for the current mirror. The drain current $I_{D304}$ of transistor 304 equals the drain current $I_{D303}$ of transistor 303. Also, the drain current of transistor 305 equals the drain current $I_{D303}$ of transistor 303.

P-channel MOSFETs 306-307 also form a current mirror. Current $I_{D304}$ equals the drain current of transistor 306. Current $I_{D304}$ is the reference bias current for current mirror 306-307. In the example of FIG. 3, transistors 306 and 307 have the same W/L channel ratios, although other W/L channel ratios can be used. Thus, the drain current $I_{CP}$ of transistor 307 equals the drain current $I_{D304}$ of transistor 306. The sum of currents $I_{Vt}$ and $I_{Gm}$ is mirrored through transistors 303, 304, and 306 to transistors 305 and 307. The drain current $I_{CP}$ of transistor 307 equals $I_{Vt}+I_{Gm}$. The drain current $I_{CP}$ of transistor 305 also equals $I_{Vt}+I_{Gm}$.

The UP signal controls the conductive state of switch 308. The DN signal controls the conductive state of switch 309. The output node 310 of charge pump 300 is coupled to resistor R1, capacitor C2, and an input of VCO 103 at $V_{CL}$, as shown in FIG. 1.

When switch 308 is closed, transistor 307 sources a current $I_{CP}$ through switch 308 to output node 310. When switch 309 is closed, transistor 305 sinks current $I_{CP}$ through switch 309 to ground.

When the phase and the frequency of the feedback clock signal FClk equals the phase and the frequency of the reference clock signal RefClk, PFD 101 generates pulses in the UP and DN signals that have the same duration. Charge pump 102 opens and closes switches 308 and 309 at the same time in response to UP and DN pulses that have the same duration. The current through switch 308 equals the current through switch 309 when both switches are closed. As a result, the net charge on the capacitors C1 and C2 in the loop filter remains constant.

When the frequency of FClk is less than the frequency of RefClk, PFD 101 generates pulses in the UP signal that have a longer duration than the pulses in the DN signal. In response to a longer pulse in the UP signal, charge pump 102 closes switch 308 and opens switch 309 for a period of time. Current $I_{CP}$ flows to the loop filter from supply voltage VCC through transistor 307 and switch 308 causing voltage $V_{CL}$ to increase.

When voltage $V_{CL}$ increases, the frequency of the output clock signal of VCO 103 and the frequency of FClk increase.

When the frequency of FClk is greater than RefClk, PFD 101 generates pulses in the DN signal that have a longer duration than the pulses in the UP signal. In response to a longer pulse in the DN signal, charge pump 102 opens switch 308 and closes switch 309 for a period of time. Current $I_{CP}$ flows away from the loop filter through switch 309 and transistor 305 to ground causing voltage $V_{CL}$ to decrease. When voltage $V_{CL}$ decreases, the frequency of the output clock signal of VCO 103 and the frequency of FClk decrease.

Figure 4A:
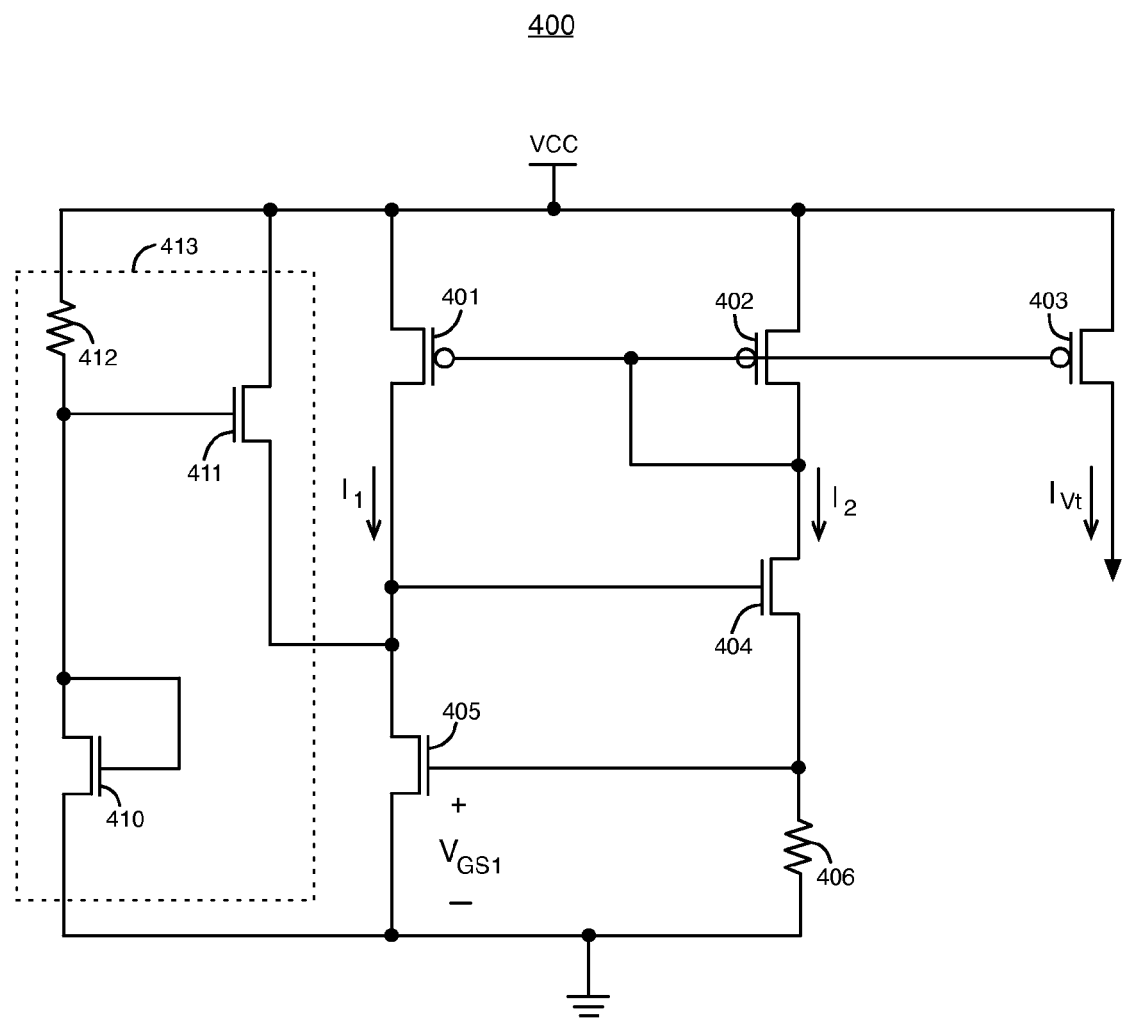
FIG. 4A illustrates a circuit schematic diagram of an example of a Vt referenced current bias circuit, according to an embodiment of the present invention.

FIG. 4A illustrates a circuit schematic diagram of an example of a Vt referenced current bias circuit, according to an embodiment of the present invention. Vt referenced current bias circuit 400 shown in FIG. 4A is one example of Vt referenced current bias circuit 301 shown in FIG. 3. Vt referenced current bias circuit 400 includes p-channel MOSFETs 401-403, n-channel MOSFETs 404-405 and 410-411, and resistors 406 and 412.

P-channel transistors 401-403 form a current mirror circuit. The drain current $I_2$ of transistor 402 is the reference current for the current mirror. Transistors 401 and 402 each have the same width-to-length (W/L) channel ratios. Therefore, the drain current $I_1$ of transistor 401 equals the drain current $I_2$ of transistor 402. The drain current $I_{Vt}$ of transistor 403 is proportional to the drain current $I_2$ of transistor 402. The ratio of $I_2$ to $I_{Vt}$ is proportional to the W/L channel ratios of transistors 402 and 403.

Current $I_1$ flows through transistor 405. Current $I_2$ flows through transistor 404 and resistor 406 creating a voltage $V_{GS1}$ between the gate and the source of transistor 405. Resistor 406 is connected between the gate and the source of transistor 405. Because the voltage across resistor 406 equals gate-source voltage $V_{GS1}$, an equilibrium point is established between the current through transistor 405 and the current through resistor 406. The equilibrium point can be determined based on the equation for the current $I_1$ through transistor 405 and the equation for the current $I_2$ through resistor 406.

Vt referenced current bias circuit 400 has two equilibrium points. One equilibrium point occurs when current $I_1$ and current $I_2$ both equal zero (i.e., the zero equilibrium point). The second equilibrium point occurs when currents $I_1$ and $I_2$ are non-zero values (i.e., the non-zero equilibrium point).

Vt referenced current bias circuit 400 has a start-up circuit 413. Start-up circuit 413 includes n-channel MOSFETs 410-411 and resistor 412. Start-up circuit 413 prevents circuit 400 from continuing to operate at the zero equilibrium point. When circuit 400 is operating at the zero equilibrium point, transistor 411 provides current through transistor 405 that causes circuit 400 to move to the non-zero equilibrium point. Once circuit 400 is operating at the non-zero equilibrium point, the current through transistor 405 essentially equals the current through transistor 401.

Equation (2) below can be used to determine the drain current $I_1$ through MOSFET 405 in saturation, wherein K is a device parameter, and $V_{THN}$ is the threshold voltage of n-channel MOSFET 405.

$$I_1 = I_2 = K(V_{GS1} - V_{THN})^2 \quad (2)$$

Device parameter K depends on the W/L channel ratio of transistor 405, the electron mobility of transistor 405, and the oxide capacitance of transistor 405. The equation for the current $I_2$ through resistor 406 is $I_2 = V_{GS1}/R_{406}$, according to Ohm's law.

When $V_{GS1} = I_2 \times R_{406}$ is substituted into equation (2), the resulting equation can be solved for $I_2$ to determine the relationship between $V_{THN}$, $R_{406}$, and $I_{Vt}$, which is shown below in equation (3). Current mirror 401-403 generates an output current $I_{Vt}$ that is proportional to $I_2$. Equation (3) illustrates that current $I_{Vt}$ is proportional to the threshold voltage $V_{THN}$ of n-channel MOSFET 405, and inversely proportional to the resistance $R_{406}$ of resistor 406.

$$I_{Vt} \propto \frac{V_{THN}}{R_{406}} \quad (3)$$

Variations in the fabrication processing of integrated circuits (ICs) can cause the threshold voltages of the transistors in some ICs to be different than the threshold voltages of the transistors in other ICs that have the same circuit design. Fabrication processing variations in the threshold voltages occur even when the same process is used in each IC and the transistors in the ICs are designed to have the same threshold voltages. N-channel MOSFETs with smaller threshold voltages cause a circuit operate faster than the same circuit having n-channel MOSFETs with larger threshold voltages.

Figure 2C:
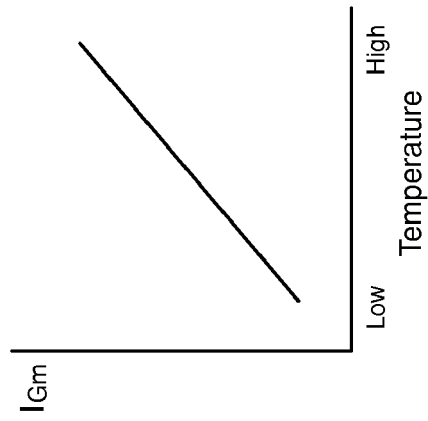
FIG. 2C illustrates the variation of current $I_{Vt}$ with the process of the integrated circuit.

The current $I_{Vt}$ generated by Vt referenced current bias circuit 400 tracks process variations of the integrated circuit. Specifically, current $I_{Vt}$ is proportional to the threshold voltages of the n-channel MOSFETs on the integrated circuit, as shown in equation (3). FIG. 2C illustrates that current $I_{Vt}$ varies with the fabrication process of the integrated circuit (IC).

$V_{THN}$ in equation (3) indicates the threshold voltages of n-channel MOSFET 405 and other n-channel MOSFETs on the IC. In an IC that has a slower process, the threshold voltages $V_{THN}$ of the n-channel transistors on the IC are larger, which causes current $I_{Vt}$ to be larger, as can be seen from equation (3). Because current $I_{Vt}$ is mirrored to the output of charge pump 102, the output current $I_{CP}$ of charge pump 102 is also larger in an IC that has a slower process. The larger output current $I_{CP}$ compensates for the smaller gain $K_{VCO}$ of VCO 103 in a slower semiconductor process. The inverse relationship between $K_{VCO}$ and $I_{Vt}$ is shown in FIGS. 2A and 2C.

In an IC that has a faster process, the threshold voltages $V_{THN}$ of the n-channel transistors on the IC are smaller, which causes current $I_{Vt}$ to be smaller, as can be seen from equation (3). Because current $I_{Vt}$ is smaller, the output current $I_{CP}$ of the charge pump 102/300 is also smaller. The smaller output current $I_{CP}$ compensates for the larger gain $K_{VCO}$ of VCO 103 in a faster semiconductor process. Output current $I_{CP}$ is the current through transistor 307 when switch 308 is closed and the current through transistor 305 when switch 309 is closed.

Thus, circuit 400 causes the bandwidth of PLL 100 to be less sensitive to fabrication process variations in integrated circuits, as can be seen from equation (1). Circuit 400 reduces the magnitude of variations in the bandwidth of PLL 100 caused by changes in the gain $K_{VCO}$ of VCO 103 that occur as a result of fabrication process variations. Circuit 400 can automatically adjust output current $I_{Vt}$ in response to fabrication process variations of the IC without requiring input from a control signal generated outside the charge pump.

According to another embodiment, the W/L channel ratio of transistor 403 is programmable. In this embodiment, the W/L channel ratio of transistor 403 is programmed to select a current $I_{Vt}$ that provides additional compensation for fabrication process variations in the gain of VCO 103. This embodiment can be implemented, for example, by using multiple MOSFETs coupled in parallel for transistor 403 and enabling one or more of the parallel MOSFETs using control signals (e.g., configuration bits).

Figure 4B:
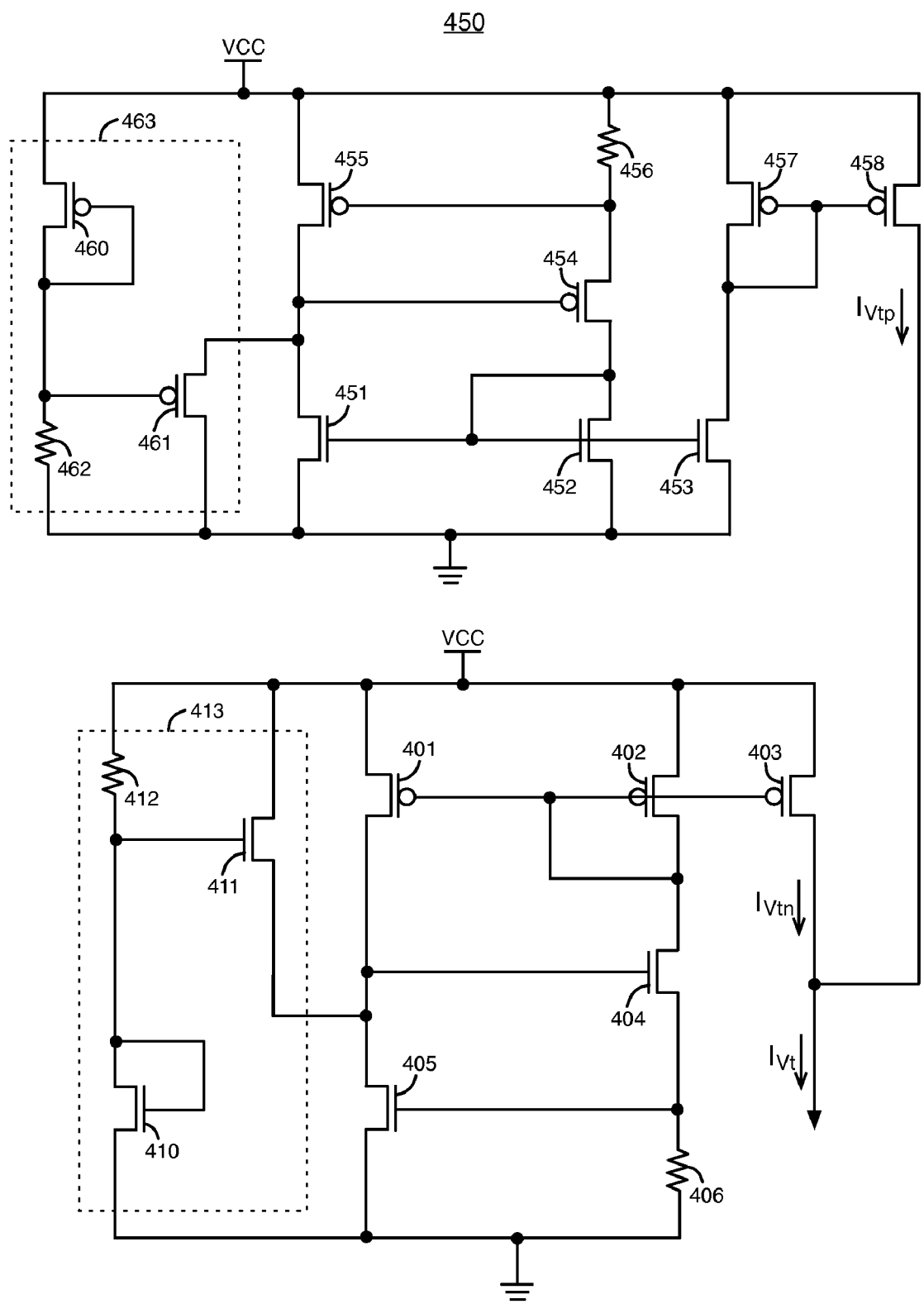
FIG. 4B illustrates a circuit schematic diagram of another example of a Vt referenced current bias circuit, according to an embodiment of the present invention.

FIG. 4B illustrates a circuit schematic diagram of another example of a Vt referenced current bias circuit, according to an embodiment of the present invention. Vt referenced current bias circuit 450 shown in FIG. 4B is another example of Vt referenced current bias circuit 301 shown in FIG. 3. Circuit 450 provides an output current $I_{Vt}$ that compensates for fabrication process variations in the threshold voltages of the n-channel and the p-channel MOSFETs on an integrated circuit containing PLL 100.

Vt referenced current bias circuit 450 includes p-channel MOSFETs 401-403, 454-455, 457-458, 460-461, n-channel MOSFETs 404-405, 410-411, 451-453, and resistors 406, 412, 456, and 462. P-channel MOSFETs 401-403, n-channel MOSFETs 404-405 and 410-411, and resistors 406 and 412 operate as described above with respect to FIG. 4A.

N-channel transistors 451-453 form a current mirror. The current through transistor 451 equals the current through transistor 452. The current through transistor 453 is proportional to the current through transistor 452. Resistor 456 is coupled between the gate and the source of p-channel transistor 455. An equilibrium point is established between the current through transistor 455 and the current through resistor 456.

Start-up circuit 463 includes p-channel MOSFETs 460-461 and resistor 462. Start-up circuit 463 causes the top half of circuit 450 to operate at a non-zero equilibrium point. The current through transistor 455 and the current through resistor 456 are both non-zero at the non-zero equilibrium point. The current through transistor 455 approximately equals the current through transistor 451 at the non-zero equilibrium point.

P-channel transistors 457-458 form a current mirror that generates an output current $I_{Vtp}$ in response to the drain current of transistor 453. Current $I_{Vtp}$ is proportional to the threshold voltage $V_{THP}$ of p-channel MOSFET 455, and inversely proportional to the resistance of resistor 456. Threshold voltage $V_{THP}$ equals the high supply voltage VCC minus the ground-referenced voltage at the gate of p-channel transistor 455 that causes transistor 455 to begin conducting current. $V_{THP}$ indicates the threshold voltages of p-channel MOSFET 455 and other p-channel MOSFETs on the integrated circuit. P-channel MOSFETs with smaller threshold voltages $V_{THP}$ cause a circuit to operate faster than the same circuit that has p-channel MOSFETs with larger threshold voltages.

The bottom half of circuit 450 generates an output current $I_{Vtn}$ that is proportional to the threshold voltage $V_{THN}$ of n-channel MOSFET 405, and inversely proportional to the resistance $R_{406}$ of resistor 406, as described above. Currents $I_{Vtn}$ and $I_{Vtp}$ are summed together to generate the output current $I_{Vt}$ of Vt referenced current bias circuit 450, as shown in equation (4).

$$I_{Vt} = I_{Vtn} + I_{Vtp} \propto \frac{V_{THN}}{R_{406}} + \frac{V_{THP}}{R_{456}} \quad (4)$$

In an IC that has a slower process, the threshold voltages $V_{THP}$ of the p-channel transistors on the IC are larger, which causes current $I_{Vt}$ to be larger, as shown in equation (4). Because current $I_{Vt}$ is mirrored to the output of charge pump 102, the output current $I_{CP}$ of charge pump 102 is also larger in an IC that has a slower process. The larger output current $I_{CP}$ compensates for the smaller gain $K_{VCO}$ of VCO 103 in a slower semiconductor process.

In an IC that has a faster process, the threshold voltages $V_{THP}$ of the p-channel transistors on the IC are smaller, which causes current $I_{Vt}$ to be smaller. Because current $I_{Vt}$ is smaller, the output current $I_{CP}$ of the charge pump 102 is also smaller. The smaller output current $I_{CP}$ compensates for the larger gain $K_{VCO}$ of VCO 103 in a faster semiconductor process. Thus, circuit 450 causes the bandwidth of PLL 100 to be less sensitive to fabrication process variations in integrated circuits, as can be seen from equation (1). Circuit 450 reduces the magnitude of variations in the bandwidth of PLL 100 caused by changes in the gain of $K_{VCO}$ of VCO 103 that occur as a result of fabrication process variations.

Figure 5:
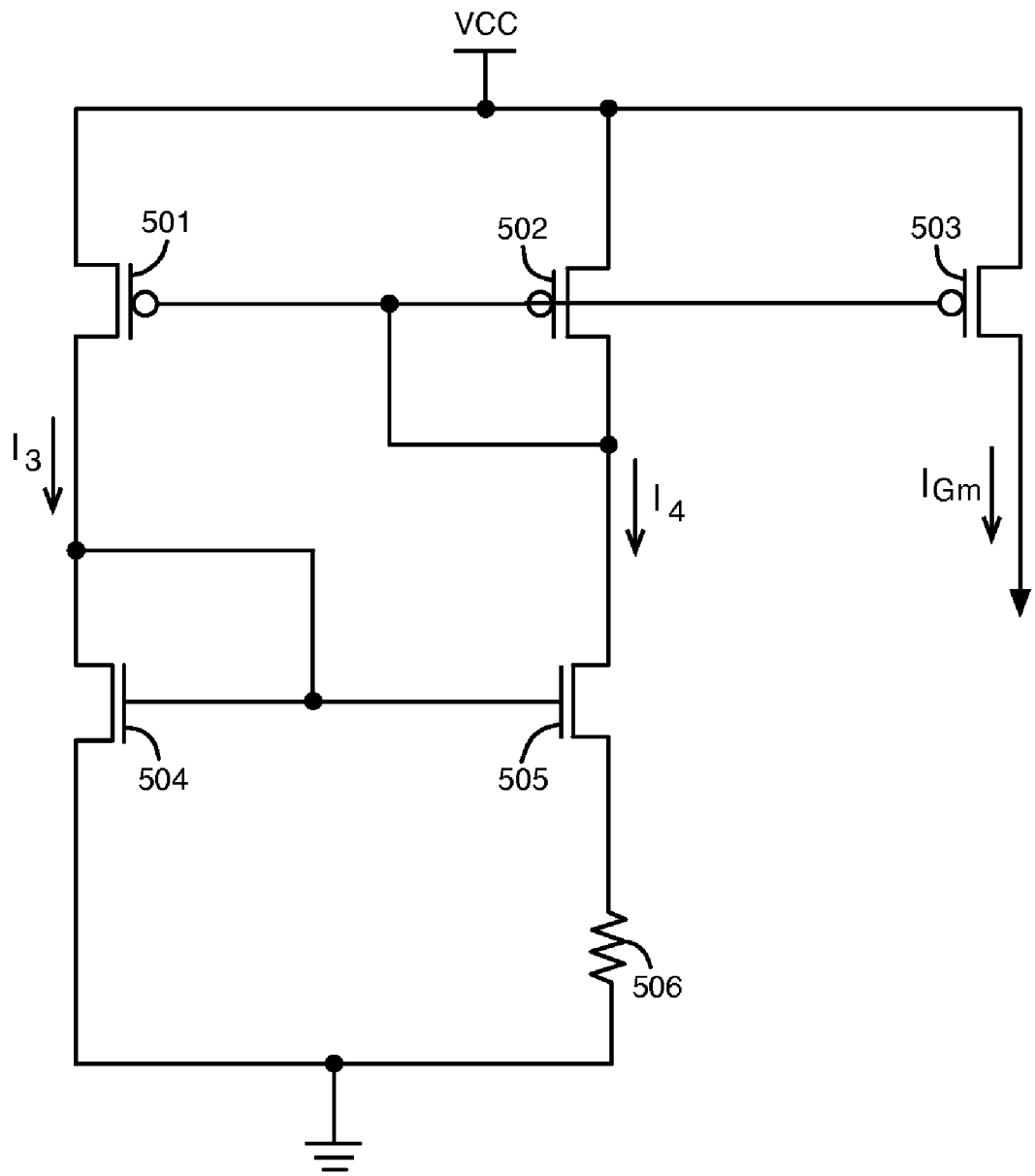
FIG. 5 illustrates a circuit schematic of a Gm based referenced current bias circuit, according to an embodiment of the present invention.

FIG. 5 illustrates a circuit schematic of Gm based referenced current bias circuit 302, according to an embodiment of the present invention. Gm based referenced current bias circuit 302 shown in FIG. 5 includes p-channel MOSFETs 501-503, n-channel MOSFETs 504-505, and resistor 506. Gm based referenced current bias circuit 302 generates a current $I_{Gm}$ that is proportional to the absolute temperature (PTAT) of the integrated circuit over a wide range of currents.

P-channel transistors 501-503 form a current mirror circuit. The drain current $I_4$ of transistor 502 is the reference current for the current mirror. Transistors 501 and 502 have the same width-to-length (W/L) channel ratios. Therefore, the drain current $I_3$ of transistor 501 equals the drain current $I_4$ of transistor 502. The drain current $I_{Gm}$ of transistor 503 is proportional to the drain current $I_4$ of transistor 502. The ratio of $I_4$ to $I_{Gm}$ is proportional to the W/L channel ratios of transistors 502 and 503.

N-channel transistors 504 and 505 operate in the sub-threshold (i.e., weak inversion) region, because the drain current of MOSFETs 504-505 is exponentially dependent on the gate-to-source voltage only in the sub-threshold region. Kirchhoff's voltage law is applied to the voltage loop around MOSFETs 501-502, 504-505 and resistor 506 to obtain equation (5) for the output current $I_{Gm}$.

$$I_{Gm} = \frac{V_T}{R_{506}} \ln\left[\frac{C(W/L)}{W/L}\right] = \frac{V_T}{R_{506}} \ln(C) \quad (5)$$

In equation (5), W/L is the width-to-length channel ratio of transistor 504, C(W/L) is the width-to-length channel ratio of transistor 505, $R_{506}$ is the resistance of resistor 506, and $V_T$ is the thermal voltage. Equation (5) shows that the output current $I_{Gm}$ of circuit 302 is proportional to the thermal voltage $V_T$. The thermal voltage $V_T$ equals kT/q, where T is the absolute temperature, k is Boltzmann's constant, and q is the magnitude of electronic charge. Thus, the output current $I_{Gm}$ of circuit 302 is proportional to the absolute temperature T of the integrated circuit, as shown in equation (6), and inversely proportional to the resistance of resistor 506.

$$I_{Gm} \propto \frac{T}{R_{506}} \quad (6)$$

Figure 2D:
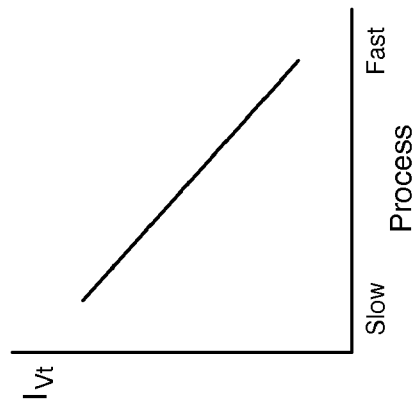
FIG. 2D illustrates the variation of current $I_{Gm}$ with the temperature of the integrated circuit.

FIG. 2D illustrates that current $I_{Gm}$ varies with the temperature of the integrated circuit. Current $I_{Gm}$ is larger when the temperature of the IC is higher. Higher temperatures (i.e., warmer temperatures) cause transistors on the IC to operate slower. Because current $I_{Gm}$ is mirrored to the output of charge pump 102, the output current $I_{CP}$ of charge pump 102 is larger at higher temperatures to compensate for the smaller gain $K_{VCO}$ of VCO 103. The inverse relationship of $K_{VCO}$ and $I_{Gm}$ is shown in FIGS. 2B and 2D.

Current $I_{Gm}$ is smaller when the temperature of the IC is lower. Lower temperatures (i.e., colder temperatures) cause transistors on the IC to operate faster. Currents $I_{Gm}$ and $I_{CP}$ are smaller at lower temperatures to compensate for the larger gain $K_{VCO}$ of VCO 103. Thus, circuit 302 causes the bandwidth of PLL 100 to be less sensitive to temperature variations of the integrated circuit, as can be seen from equation (1). Circuit 302 reduces the magnitude of variations in the bandwidth of PLL 100 caused by changes in the gain $K_{VCO}$ of VCO 103 that occur as a result of temperature variations of the integrated circuit. Circuit 302 can automatically adjust output current $I_{Gm}$ in response to temperature variations even when the PLL is in lock, without requiring input from a control signal generated outside the charge pump.

According to another embodiment, the W/L channel ratio of transistor 503 is programmable. The W/L channel ratio of transistor 503 can be programmed to select a current $I_{Gm}$ that provides additional compensation for temperature variations in the gain of VCO 103. This embodiment can be implemented, for example, by using multiple MOSFETs coupled in parallel for transistor 503 and enabling one or more of the parallel MOSFETs using control signals (e.g., configuration bits).

The current $I_{Gm}$ generated by Gm based referenced current bias circuit 302 is inversely proportional to the resistance of resistor 506 as shown in equation (6). Current $I_{Vt}$ generated by Vt referenced current bias circuit 301 is inversely proportional to the resistance of resistors 406 and 456 as shown in equations (3) and (4). When the resistances of resistors 406, 456, and 506 are larger, currents $I_{Gm}$, $I_{Vt}$, and $I_{CP}$ are smaller. When the resistances of resistors 406, 456, and 506 are smaller, currents $I_{Gm}$, $I_{Vt}$, and $I_{CP}$ are larger. The relationships between $I_{Vt}$ and $I_{Gm}$ and resistors 406, 456, and 506 cancel out variations in the resistance $R_1$ of resistor R1 in equation (1).

Equation (7) below is derived by substituting $I_{CP}$ in equation (1) for $I_{Vt}$ from equation (3) plus $I_{Gm}$ from equation (6).

$$B_{LP} \propto \left[ \frac{(V_{THN} \times R_1)}{R_{406}} + \frac{(T \times R_1)}{R_{506}} \right] \times K_{VCO} \qquad (7)$$

An equation can also be derived for a charge pump that has circuit 450 by substituting equations (4) and (6) into equation (1). Process and temperature changes in an integrated circuit cause the resistances of resistors R1, 406, 456, and 506 to vary by the same percentage, because resistors R1, 406, 456, and 506 are formed by the same type of resistive material (e.g., P+ poly material in the silicon).

Percentage changes in resistors R1, 406, and 506 cancel out from the numerators and denominators of equation (7). As a result, circuit 302 causes the bandwidth of PLL 100 to be less sensitive to variations in the resistance of resistor R1 in the loop filter. Circuits 301 and 302 reduce the magnitude of variations in the bandwidth of PLL 100 caused by variations in the resistance of resistor R1 that occur as a result of temperature and fabrication process variations. The charge pump can automatically adjust its output current in response to variations in the resistances of resistors 406, 456, and 506 even when the PLL is in lock, without requiring input from a control signal generated outside the charge pump.

Figure 6:
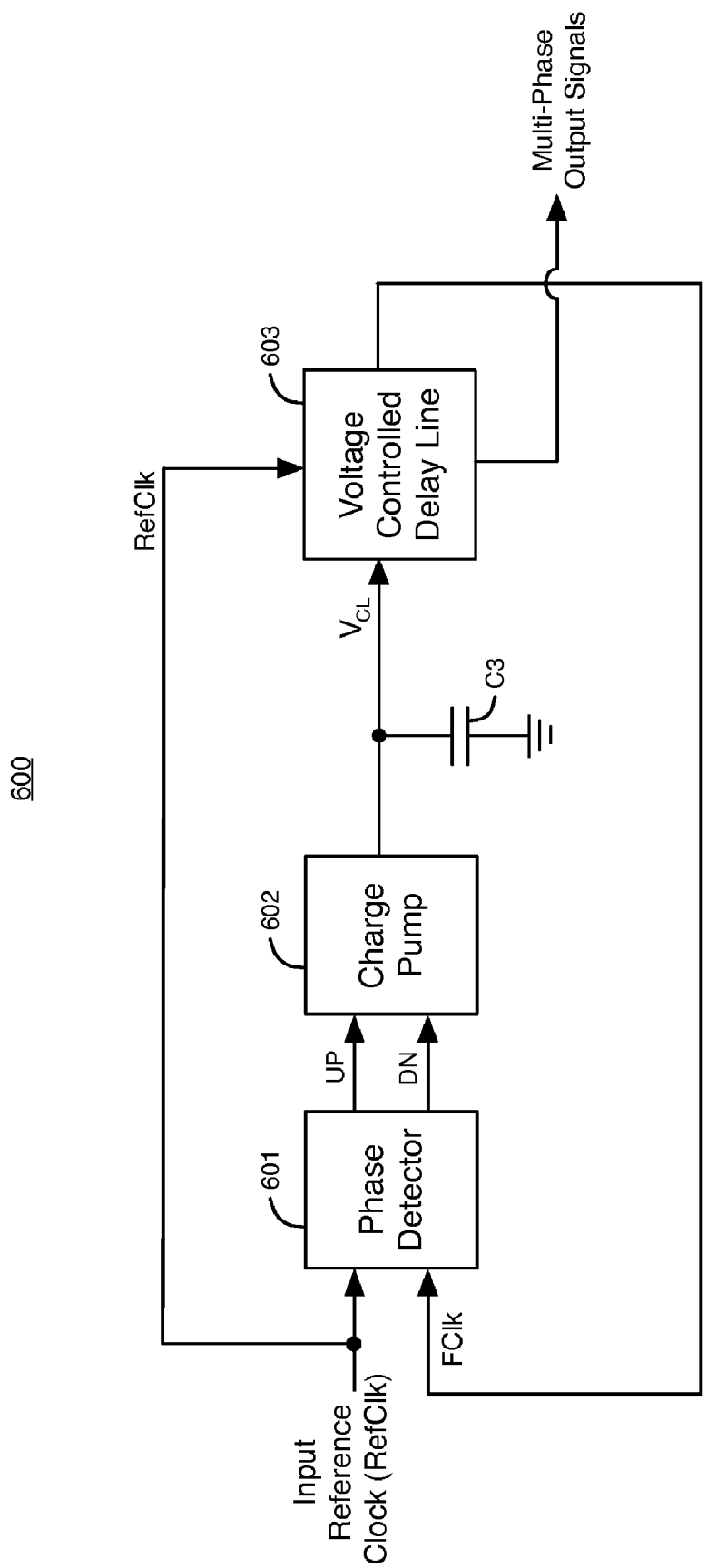
FIG. 6 illustrates a delay locked loop (DLL) that can include embodiments of the present invention.

FIG. 6 illustrates a delay-locked loop (DLL) 600 that can include embodiments of the present invention. DLL 600 is one example of a DLL that can include embodiments of the present invention. It should be understood that embodiments of the present invention can be used with DLLs having numerous other configurations.

Delay-locked loop 600 is a feedback loop circuit that includes a phase detector circuit 601, a charge pump circuit 602, a capacitor C3, and a voltage-controlled delay line (VCDL) circuit 603. Phase detector 601 compares an input reference clock signal RefClk to a feedback clock signal FClk that has the same frequency. Because the frequencies of RefClk and FClk are the same, phase detector 601 compares the phases of these two signals.

Phase detector 601 generates UP and DN error signals that are indicative of the difference between the phases of RefClk and FClk. The UP and DN error signals are transmitted to charge pump 602. Charge pump 602 converts the UP and DN error signals into a control voltage $V_{CL}$.

Capacitor C3 is a loop filter that is coupled between the output node of charge pump 602 and ground. Capacitor C3 filters high frequency signals in the control voltage $V_{CL}$.

Voltage-controlled delay line (VCDL) 603 includes a set of delay circuits. The delay circuits delay the reference clock signal RefClk to generate the feedback clock signal FClk. VCDL 603 sets the delay of the delay circuits in response to the control voltage $V_{CL}$. DLL 600 adjusts the phase of FClk in response to changes in control voltage $V_{CL}$ until the phase of FClk matches the phase of RefClk. VCDL 603 also generates a set of output signals that have multiple phases.

According to an embodiment of the present invention, charge pump circuit 300 shown in FIG. 3 is used as charge pump circuit 602. The loop bandwidth $\omega_N$ of DLL 600 is shown in equation (8), where $I_{CP}$ is the output current of charge pump 602, $K_{DL}$ is the gain of VCDL 603, $F_{REF}$ is the frequency of the reference clock signal RefClk, and $C_3$ is the capacitance of capacitor C3.

$$\omega_N = I_{CP} \times K_{DL} \times F_{REF} \times \frac{1}{C_3} \qquad (8)$$

Variations in the integrated circuit fabrication process cause $K_{DL}$ to change. $K_{DL}$ is inversely proportional to the threshold voltages of n-channel transistors on the integrated circuit. The gain $K_{DL}$ of VCDL 603 is larger in integrated circuits that have faster processes and smaller n-channel transistor threshold voltages. The gain $K_{DL}$ of VCDL 603 is smaller in integrated circuits that have slower processes and larger n-channel transistor threshold voltages.

$K_{DL}$ is inversely proportional to the temperature of the integrated circuit. The gain $K_{DL}$ of VCDL 603 is larger when the temperature of the integrated circuit is smaller. The gain $K_{DL}$ of VCDL 603 is smaller when the temperature of the integrated circuit is larger.

As described above, the current $I_{Vt}$ generated by Vt referenced current bias circuit 301 tracks fabrication process variations of the integrated circuit. Specifically, current $I_{Vt}$ is proportional to the threshold voltages of the MOSFETs on the integrated circuit. The current $I_{Gm}$ generated by Gm based referenced current bias circuit 302 is proportional to the temperature of the integrated circuit. As a result, charge pump 300 causes the bandwidth $\omega_N$ of DLL 600 to be less sensitive to fabrication process and temperature variations of the integrated circuit, as can be seen from equation (8). Charge pump 300 reduces the magnitude of variations in the bandwidth of DLL 600 caused by changes in the gain $K_{DL}$ of VCDL 603 that occur as a result of temperature and fabrication process variations of the integrated circuit.

According to another embodiment of the present invention, a clock and data recovery (CDR) PLL can include charge pump circuit 300 that adjusts its output current in response to variations in the fabrication process and the temperature of the IC to reduce the magnitude of variations in the loop bandwidth.

Figure 7:
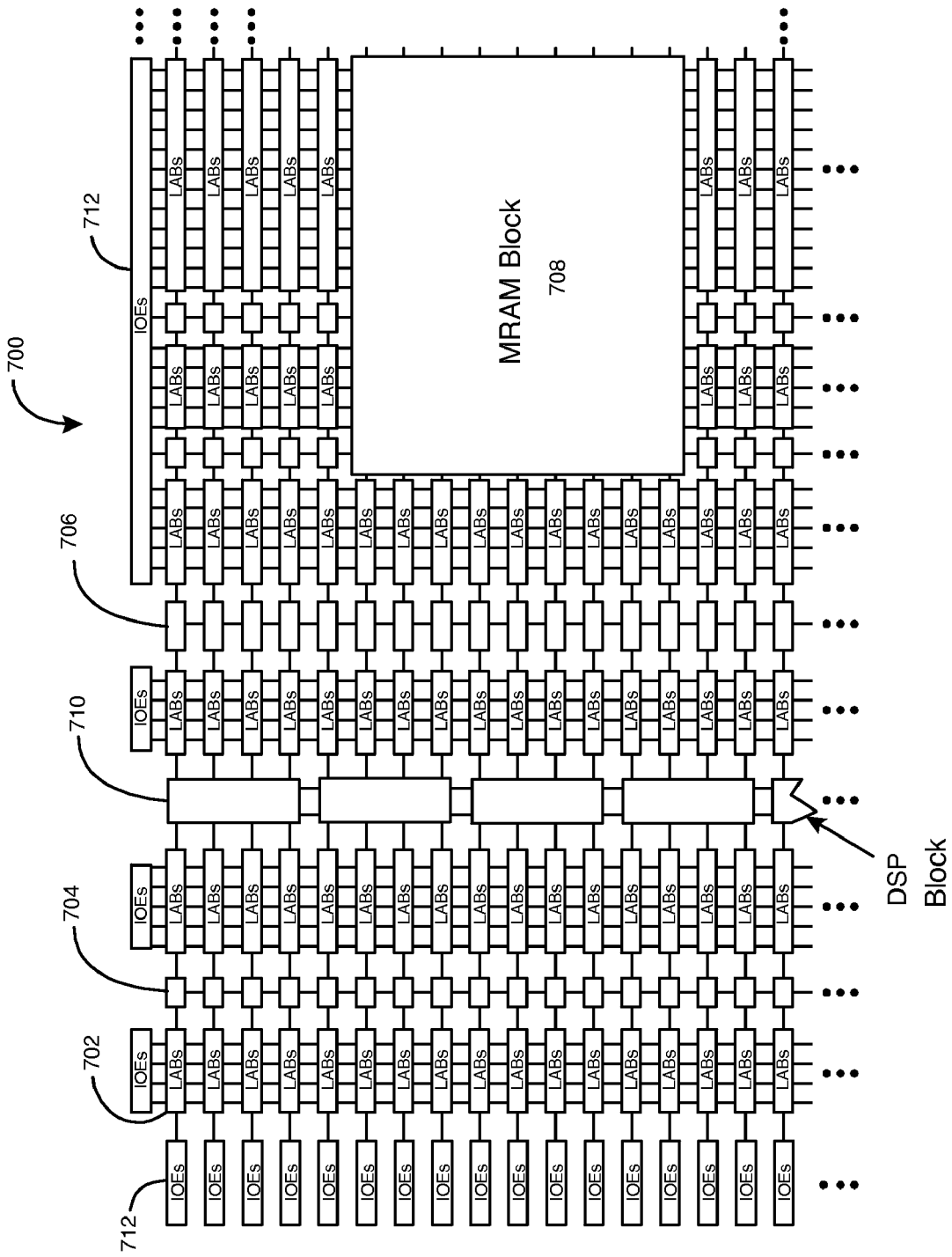
FIG. 7 is a simplified partial block diagram of a field programmable gate array (FPGA) that can include aspects of the present invention.

FIG. 7 is a simplified partial block diagram of an FPGA 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. Input/output element (IOE) blocks 712 located, in this example, around the periphery of the chip support numerous single-ended and differential input/output standards. It is to be understood that FPGA 700 is described herein for illustrative purposes only and that the present invention can be implemented in many different types of PLDs, FPGAs, and ASICs.

Figure 8:
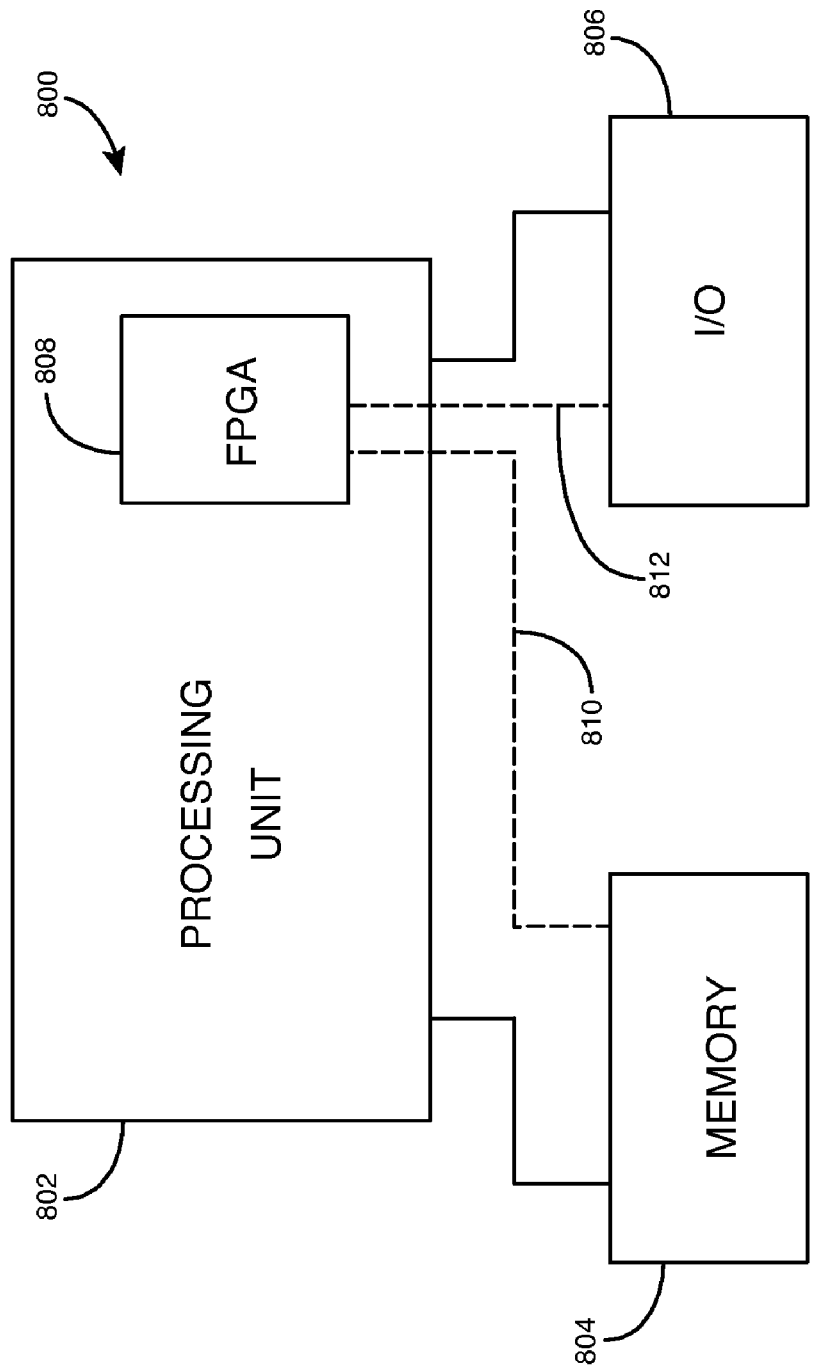
FIG. 8 shows a block diagram of an exemplary digital system that can embody techniques of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising a feedback loop, the feedback loop comprising:
    a detector;
    a charge pump that generates an output current in response to at least one output signal of the detector, wherein the charge pump comprises a first current source generating a first current that varies based on threshold voltages of transistors in the circuit; and
    a loop filter coupled to the charge pump, wherein the charge pump adjusts the output current in response to variations in a process of the circuit to reduce variations in a bandwidth of the feedback loop.

2. The circuit defined in claim 1 wherein the feedback loop further comprises:
    an oscillator circuit coupled to the loop filter, wherein the charge pump adjusts the output current in response to variations in a temperature of the circuit and the process of the circuit to compensate for variations in a gain of the oscillator circuit and to reduce variations in the bandwidth of the feedback loop.

3. The circuit defined in claim 2 wherein the feedback loop is a phase-locked loop, and the detector is a phase-frequency detector.

4. The circuit defined in claim 2 wherein the charge pump comprises a second current source generating a second current that varies in proportion to the temperature of the circuit, and wherein the first current generated by the first current source varies in proportion to threshold voltages of n-channel transistors on the circuit.

5. The circuit defined in claim 4 wherein the first current source comprises a first resistor, the second current source comprises a second resistor, and the output current of the charge pump is inversely proportional to resistances of the first and the second resistors.

6. The circuit defined in claim 4 wherein the first current generated by the first current source varies in proportion to threshold voltages of p-channel transistors on the circuit.

7. The circuit defined in claim 4 wherein the first current source comprises a p-channel current mirror coupled to an n-channel current mirror.

8. The circuit defined in claim 4 wherein the first current source comprises a current mirror, a first transistor coupled to the current mirror, and a second transistor coupled to the current mirror, wherein a drain of the first transistor is coupled to a gate of the second transistor, and a source of the second transistor is coupled to a gate of the first transistor.

9. The circuit defined in claim 3 wherein a voltage regulator provides a regulated voltage to the charge pump and the oscillator circuit to reduce an impact of variations in an external supply voltage on the bandwidth of the phase-locked loop.

10. The circuit defined in claim 1 wherein the circuit is a programmable logic integrated circuit.

11. An integrated circuit comprising a feedback loop, the feedback loop comprising:
    a phase detector; and
    a charge pump that generates an output current in response to at least one output signal of the phase detector, wherein the charge pump adjusts the output current in response to variations in temperature and process of the integrated circuit to reduce variations in a bandwidth of the feedback loop,
    wherein the charge pump comprises a first current source generating a first current that varies in proportion to the temperature of the integrated circuit, and a second current source generating a second current that varies in proportion to threshold voltages of transistors on the integrated circuit.

12. The integrated circuit defined in claim 11 wherein the feedback loop further comprises:
    a loop filter coupled to an output of the charge pump; and
    a delay line coupled to the loop filter, wherein the charge pump adjusts the output current in response to variations in the temperature and the process of the integrated circuit to compensate for variations in a gain of the delay line.

13. The integrated circuit defined in claim 11 wherein the second current generated by the second current source varies in proportion to threshold voltages of n-channel transistors on the integrated circuit.

14. The integrated circuit defined in claim 13 wherein the second current generated by the second current source varies in proportion to threshold voltages of p-channel transistors on the integrated circuit.

15. The integrated circuit defined in claim 14 wherein the second current source comprises a third current source generating a third current that is proportional to the threshold voltages of the n-channel transistors on the integrated circuit, and a fourth current source generating a fourth current that is proportional to the threshold voltages of the p-channel transistors on the integrated circuit, and wherein the second current is a sum of the third and the fourth currents.

16. The integrated circuit defined in claim 13 wherein the second current source comprises a p-channel current mirror coupled to an n-channel current mirror.

17. A method for generating a periodic output clock signal using a loop circuit on an integrated circuit (IC), the method comprising:
    comparing a first signal to a second signal using a detector to generate at least one output signal;
    generating an output current in response to the at least one output signal of the detector using a charge pump;
    filtering an output voltage of the charge pump using a loop filter; and
    adjusting the output current of the charge pump in response to process and temperature variations of the IC based on a first current that varies in proportion to the temperature of the IC and a second current that varies in proportion to threshold voltages of transistors on the IC to reduce changes in a bandwidth of the loop circuit.

18. The method defined in claim 17 wherein the loop filter comprises a first resistor, the first current is generated by a first current source, and the second current is generated by a second current source.

19. The method defined in claim 18 wherein the first current source comprises a second resistor, the second current source comprises a third resistor, and the output current of the charge pump is inversely proportional to resistances of the second and the third resistors.

20. The method defined in claim 17 wherein the second current varies in proportion to threshold voltages of n-channel and p-channel transistors on the integrated circuit.

* * * * *